United States Patent [19]
Yamazaki et al.

[11] Patent Number: 6,133,076
[45] Date of Patent: *Oct. 17, 2000

[54] MANUFACTURING METHOD OF SEMICONDUCTOR

[75] Inventors: Shunpei Yamazaki, Tokyo; Satoshi Teramoto, Kanagawa, both of Japan

[73] Assignee: Semiconductor Energy Laboratory Co., Ltd., Japan

[ * ] Notice: This patent is subject to a terminal disclaimer.

[21] Appl. No.: 09/379,981

[22] Filed: Aug. 24, 1999

[51] Int. Cl.[7] .............................. H01L 21/00; H01L 21/84

[52] U.S. Cl. ............................. 438/166; 438/487; 257/59; 349/39

[58] Field of Search ................................ 257/59; 438/487; 349/39

[56] References Cited

U.S. PATENT DOCUMENTS

| | | | |
|---|---|---|---|
| 729,308 | 3/1998 | Yamazaki et al. | 349/39 |
| 5,536,950 | 7/1996 | Liu et al. | 257/59 |
| 5,963,823 | 8/1999 | Yamazaki et al. | 438/487 |

Primary Examiner—John F. Niebling
Assistant Examiner—Viktor Simkovic
Attorney, Agent, or Firm—Fish & Richardson P.C.

[57] ABSTRACT

A microwave is applied, in an atmosphere that prohibits formation of plasma, to an amorphous silicon film that has been formed on a glass substrate by a vapor phase method. Since the microwave is absorbed selectively by a surface layer of the amorphous silicon film due to the skin effect, the amorphous silicon film can be heated selectively and thereby modified into a crystalline silicon film without heating the glass substrate.

38 Claims, 7 Drawing Sheets

MANUFACTURING METHOD OF SEMICONDUCTOR

BACKGROUND OF THE INVENTION

1. Field of the Invention

The present invention relates to a manufacturing method of a thin-film semiconductor formed on a substrate having an insulative surface, such as a glass substrate.

2. Description of the Related Art

In recent years, a thin-film transistor attracts attention as a semiconductor device using a thin-film semiconductor. In particular, a configuration in which thin-film transistors are incorporated in a liquid crystal electro-optical device attracts much attention. In this liquid crystal electro-optical device, a thin-film semiconductor is formed on a glass substrate that is a component of the device, and thin-film transistors are constructed by using the thin-film semiconductor. Provided for each pixel electrode of the liquid crystal electro-optical device, the thin-film transistor serves as a switching element for controlling charge entering or exiting the pixel electrode. Called an active matrix liquid crystal display device, this device can display images of very high quality.

An amorphous silicon thin film is mainly used as a thin-film semiconductor for thin-film transistors. However, at present, thin-film transistors formed by using an amorphous silicon thin film cannot provide necessary characteristics.

To improve the characteristics of an amorphous silicon film, it is effective to crystallize it into a crystalline silicon film. Among the known methods of obtaining a crystalline silicon film is a method in which an amorphous silicon film formed by plasma CVD or low-pressure thermal CVD is subjected to a heat treatment.

On the other hand, in utilizing thin-film transistors in an active matrix liquid crystal electro-optical device, there is a problem that a glass substrate needs to be used from the economical point of view.

To crystallize an amorphous silicon film by a heat treatment, it should be performed at a temperature higher than 600° C. for more than several tens of hours. But such a heat treatment may warp or deform a glass substrate. This is particularly remarkable in a large-area glass substrate. Since a liquid crystal electro-optical device is constructed such that a liquid crystal is interposed and held between two glass substrates that are bonded to each other with a gap of several micrometers, deformation of the glass substrates is undesirable because it may cause unevenness in display, for instance.

This problem may be solved by using quartz substrates or special glass substrates that can endure a high-temperature heat treatment. However, since such substrates are expensive, it is difficult to use those substrates from the viewpoint of the manufacturing cost.

There is known a technique of crystallizing an amorphous silicon film by irradiating it with laser light. Although this technique is advantageous in being capable of locally forming a crystalline silicon film having very high crystallinity, it has a difficulty in providing a uniform effect of irradiation with laser light over the entire film. Further, resulting crystalline silicon films vary in quality from one process to another; in other words, this technique is low in reproducibility.

SUMMARY OF THE INVENTION

An object of the present invention is to provide a method for obtaining a crystalline silicon film having superior crystallinity, particularly when a glass substrate is used.

According to one aspect of the invention, there is provided a manufacturing method of a semiconductor, comprising the steps of forming an amorphous silicon film on a substrate having an insulative surface; and modifying the amorphous silicon film into a crystalline silicon film by heating a surface of the amorphous silicon film selectively by applying a microwave to it.

In this method, a typical example of the substrate having an insulative surface is a glass substrate. The invention is effective when applied to a glass substrate, which is not durable to heating. In addition to a glass substrate, a quartz substrate and a semiconductor substrate on which an insulting film is formed may be used.

The amorphous silicon film may be one formed by plasma CVD or low-pressure thermal CVD. An amorphous silicon film formed by low-pressure thermal CVD is particularly favorable because it has a small hydrogen content and is therefore easily crystallized.

A proper frequency range of the microwave is 1 to 10 GHz. The reason why an amorphous silicon film is modified into a crystalline silicon film by application of microwaves is that the microwaves are absorbed by Si-H bonds and, as a result, the amorphous silicon film is heated. Where a glass substrate is used, there is an advantage that it is not directly heated because microwaves are absorbed by a surface layer of the amorphous silicon film due to the skin effect. This is advantageous when a glass substrate is used, which is not durable to heating.

Where an amorphous silicon film formed on a glass substrate is heated by irradiating it with microwaves from its front-surface side, crystal growth starts from its front surface and proceeds uniformly.

FIG. 9 schematically shows a case where an undercoat silicon oxide film 902 is formed on a glass substrate 901, an amorphous silicon film 903 is formed thereon by plasma CVD or low-pressure thermal CVD, and then the amorphous silicon film 903 is crystallized by heating it with a heater.

In this case, crystal growth starts from the substrate side as indicated by arrows 904 because of heat conduction from the side of the glass substrate 901 having large heat capacity, existence of defects and stress serving as nuclei of crystallization at the boundary between the undercoat silicon oxide film 902 and the amorphous silicon film 903, and other factors. Since nuclei of crystallization are distributed nonuniformly, crystal growth also proceeds non-uniformly.

On the other hand, FIG. 10 schematically shows a case where an undercoat silicon oxide film 902 is formed on a glass substrate 901, an amorphous silicon film 903 is formed thereon by plasma CVD or low-pressure thermal CVD, and then the amorphous silicon film 903 is crystallized by irradiating it with microwaves 906.

In this case, since the microwaves 906 are absorbed by a surface layer of the amorphous silicon film 903 selectively, the amorphous silicon film 903 is heated selectively in its surface layer. Therefore, crystal growth starts from the surface of the amorphous silicon film 903 as indicated by arrows 905. Unlike the case of FIG. 9. this crystallization process is not influenced by the glass substrate 901 and the state of the boundary between the undercoat silicon oxide film 902 and the amorphous silicon film 903.

According to another aspect of the invention, there is provided a manufacturing method of a semiconductor, comprising the steps of forming an amorphous silicon film on a substrate having an insulative surface; and modifying the amorphous silicon film into a crystalline silicon film by applying a microwave to it in a high vacuum atmosphere.

In this method, the high vacuum state means a state where the degree of vacuum is kept as high as possible. This state depends on the performance of an exhaust pump used, its maintenance state, and even a vacuum chamber used. However, it is important to provide as high a degree of vacuum as possible.

Providing as high a degree of vacuum as possible is to prohibit formation of plasma due to application of microwaves. Once plasma is formed, ions and active species of the plasma etch a film or form defects therein, which is unfavorable for formation of a superior crystalline silicon film.

According to a further aspect of the invention, there is provided a manufacturing method of a semiconductor, comprising the steps of forming an amorphous silicon film on a substrate having an insulative surface; and modifying the amorphous silicon film into a crystalline silicon film by applying a microwave to it in an atmosphere that prohibits formation of plasma.

An example of the atmosphere that prohibits formation of plasma is an atmosphere where the degree of vacuum is kept as high as possible. (It is noted that except in a perfect vacuum. plasma is generated by application of high power.)

An air atmosphere is an atmosphere where plasma is not generated easily. However, whether plasma is venerated or not depends on the frequency and power of input microwaves. Therefore, the state where formation of plasma is prohibited is defined here as a state where plasma light is not recognized visually.

The manufacturing method of a semiconductor according to the invention may further comprise the step of holding, before or after forming the amorphous silicon film, a metal element for accelerating crystallization of silicon so that the metal element is in contact with the front or back surface of the amorphous silicon film.

The metal element for accelerating crystallization of silicon may be one or a plurality of elements selected from the group consisting of Fe, Co, Ni, Ru, Rh, Pd, Os, Ir, Pt, Cu and Au.

Among the above metal elements, Ni (nickel) is particularly effective. Experiments have shown that effects of using Ni are obtained with high reproducibility.

To introduce a metal element, it is preferred to apply a solution containing the metal element. To hold the metal element so that it is in contact with the back surface of an amorphous silicon film, the metal element may be held in contact with a surface on which the amorphous silicon film is to be formed. To hold the metal element so that it is in contact with the front surface of an amorphous silicon film, the metal element may be held in contact with the amorphous silicon film already formed. It is important to take some measure so that the metal film is finally contained in a silicon at a concentration of $1\times10^{16}$ to $1\times10^{19}$ atoms/cm$^3$. The concentration of the metal element is defined as a minimum value obtained by SIMS (secondary ion mass spectrometry).

A description will be made of how the metal element is introduced by using a solution. For example, where the metal element is Ni, there may be used at least one nickel compound selected from the following: nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, nickel hydroxide, and nickel 2-ethylhexanoate. An element of nickel can be introduced by applying a solution of one or a plurality of the above compounds to an amorphous silicon film or a surface on which an amorphous silicon film is to be formed.

There may be used a solution in which Ni is mixed into a non-polar solvent such as benzene, toluene, xylene, carbon tetrachloride, chloroform, ether, trichloroethylene, or fleon.

Where the metal element is Fe (iron), there may be used an iron salt selected from, for instance, ferrous bromide (FeBr$_2$ 6H$_2$O), ferric bromide (FeBr$_3$ 6H$_2$O), ferric acetate (Fe(C$_2$H$_3$O$_2$)$_3$ x H$_2$O), ferrous chloride (FeCl$_2$ 4H$_2$O), ferric chloride (FeCl$_3$ 6H$_2$O), ferric fluoride (FeF$_3$ 3H$_2$O), ferric nitrate (Fe(NO$_3$)$_3$ 9H$_2$O), ferrous phosphate (Fe$_3$(PO$_4$)$_2$ 8H$_2$O), and ferric phosphate (FePO$_4$ 2H$_2$O).

Where the metal element is Co (cobalt), there may be used a cobalt salt selected from, for instance, cobalt bromide (CoBr 6H$_2$O), cobalt acetate (Co(C$_2$H$_3$O$_2$)$_2$ 4H$_2$O), cobalt chloride (CoCl$_2$ 6H$_2$O), cobalt fluoride (CoF$_2$ x H$_2$O), and cobalt nitrate (Co(NO$_3$)$_2$ 6H$_2$O).

Where the metal element is Ru (ruthenium), there may, be used a ruthenium salt such as ruthenium chloride (RuCl$_3$ H$_2$O).

Where the metal element is Rh (rhodium), there may be used a rhodium salt such as rhodium chloride (RhCl$_3$ 3H$_2$O).

Where the metal element is Pd (palladium), there may be used a palladium salt such as palladium chloride (PdCl$_2$ 2H$_2$O).

Where the metal element is Os (osmium), there may be used an osmium salt such as osmium chloride (OsCl$_3$).

Where the metal element is Ir (iridium), there may be used an iridium salt selected from, for instance, iridium trichloride (IrCl$_3$ 3H$_2$O) and iridium tetrachloride (IrCl$_4$).

Where the metal element is Pt (platinum), there may be used, as its compound, a platinum salt such as platinic chloride (PtCl$_4$ 5H$_2$O).

Where the metal element is Cu (copper), there may be used a material selected from cupric acetate (Cu(CH$_3$COO)$_2$), cupric chloride (CuCl$_2$ 2H$_2$O), and cupric nitrate (Cu(NO$_3$)$_2$ 3H$^2$O).

Where the metal element is Au (gold), there may be used a material selected from gold trichloride (AuCl$_3$ x H$_2$O) and a gold chloride salt (AuHCl$_4$ 4H$_2$O).

The above method of using a solution is very effective for uniform crystallization because the metal element can be held in contact with an amorphous silicon film while being dispersed, and its concentration can be controlled easily.

An amorphous silicon film that has been formed by a vapor phase method can be crystallized by heating it by application of microwaves in a high vacuum. Being easily absorbed by Si-H bonds essentially, microwaves are absorbed selectively by an amorphous silicon film containing a large amount of hydrogen. In particular, due to the skin effect, microwaves are absorbed selectively by a surface layer of an amorphous silicon film, so that the amorphous silicon film is heated selectively in the surface layer. The energy of this heating accelerates removal of hydrogen molecules from the film, so that the ratio of Si-Si bonds increases. In this manner, the amorphous silicon film is modified into a crystalline silicon film.

If an amorphous silicon film is preliminarily subjected to a heat treatment to remove hydrogen from the film, the crystallization by application of microwaves can be performed with higher reproducibility and the crystallinity itself can be made higher. Heating or application of laser light after the microwave irradiation is effective in enhancing the reproducibility of producing crystalline silicon films, i.e., in producing crystalline silicon films of given quality in a more stable manner.

Utilization of a metal element for accelerating crystallization of silicon improves the reproducibility of the crystallization process as well as the crystallinity itself of a resulting crystalline silicon film.

DETAILED DESCRIPTION OF THE PREFERRED EMBODIMENTS

Embodiment 1

This embodiment is directed to a method of forming a crystalline silicon film on a glass substrate. First, a silicon oxide film as an undercoat film is formed on a glass substrate. This silicon oxide film serves to prevent impurities from diffusing from the glass substrate as well as to reduce stress occurring between the glass substrate and a semiconductor film. The silicon oxide film may be formed at a thickness of about 3,000 Å by plasma CVD or sputtering.

An amorphous silicon film is then formed by plasma CVD or low-pressure thermal CVD. The amorphous silicon film may be formed at a necessary thickness, and is formed at 500 Å in this embodiment.

The amorphous silicon film thus formed is heated by irradiating it with microwaves of 2.45 GHz.

Figure 1:
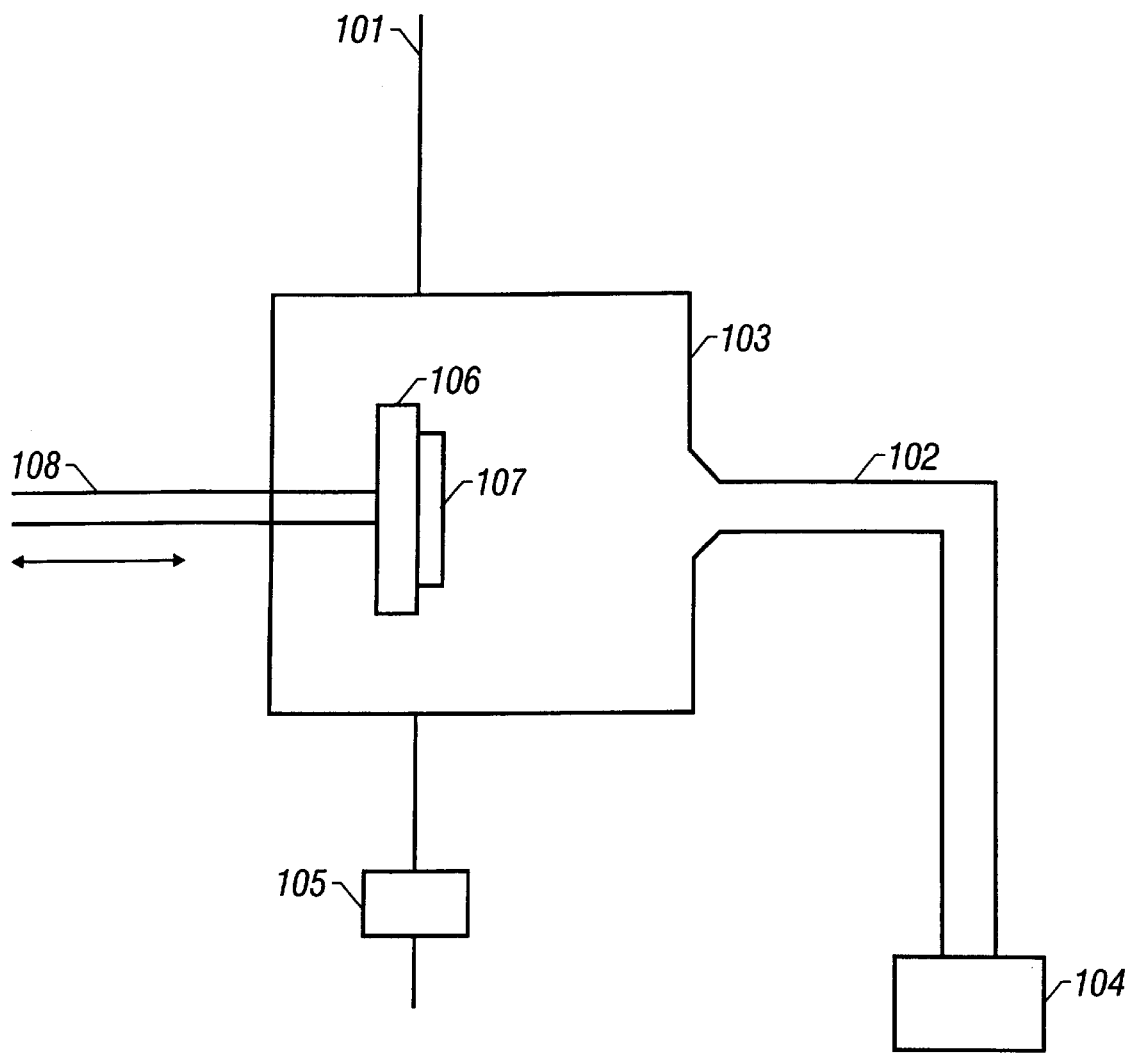
FIG. 1 schematically shows an apparatus for applying microwaves used in the present invention.

FIG. 1 schematically shows an apparatus for irradiating the amorphous silicon film with microwaves. In this apparatus, microwaves of 2.45 GHz (output power: 5 kW) generated by an oscillator 104 are applied to a glass substrate 107 on which an amorphous silicon film is formed and which is placed on a substrate holder 106, whereby the amorphous silicon film on the glass substrate 107 is crystallized.

The microwave irradiation process starts with a step of introducing the substrate 107 into a vacuum chamber 103. The substrate is placed on the substrate holder 106, which can be reciprocated by an adjustment rod 108. This is because the position of the substrate 107 is important for a certain state of a standing wave generated in the chamber 103. In this embodiment, the substrate 107 is placed at a region where the electric field intensity of microwaves is maximum.

After the substrate 107 is set in place, the chamber 103 is closed and the air is purged by using a nitrogen gas. A high vacuum state is established by using an exhaust pump 105. It is desired that the exhaust pump 105 is a pump capable of providing a high vacuum state, such as turbo molecular pump. For certain types of turbo molecular pumps which may be broken if used at the normal pressure, a rotary pump may be used additionally.

It is preferred that the high vacuum state is a vacuum state of such a level that formation of plasma is avoidable.

After a high vacuum state is established in the chamber 103 by the exhaust pump 105, the microwave oscillator 104 is operated to produce microwaves of 2.45 GHz. The microwaves are introduced into the chamber 103 via a waveguide 102, and applied to the amorphous silicon film formed on the substrate 107 to crystallize it.

Since a heater is incorporated in the substrate holder 106, the substrate 107 can be heated to a given temperature, 550° C. in this embodiment. It is desirable that this temperature is set as high as possible but lower than the strain point of the glass substrate 107. In general, the temperature may be set in a range of 400° C. to the strain point of the glass substrate 107. Where a substrate other than the glass substrate 107 is used, the upper limit of the heating temperature may be determined in consideration of the heat resistance of the substrate used.

In general, measurement of the heating temperature is performed on the back surface of the glass substrate 107. Therefore, it is difficult to accurately measure the temperature of the silicon film formed on the glass substrate 107. In this case, the temperature of the back surface of the glass substrate may be used as the heating temperature.

After the amorphous silicon film is crystallized by irradiating it with microwaves, the substrate 107 is taken out of the apparatus and the crystallization process is completed.

Embodiment 2

This embodiment is directed to a method of forming a crystalline silicon film on a glass substrate by crystallizing an amorphous silicon film with application of a metal element for accelerating crystallization of silicon.

First, a silicon oxide film as an undercoat film is formed on a glass substrate. This silicon oxide film serves to prevent impurities from diffusing from the glass substrate as well as to reduce stress occurring between the glass substrate and a semiconductor film. The silicon oxide film may be formed at a thickness of about 3,000 Å by plassma CVD or sputtering.

An amorphous silicon film is then formed by plasma CVD or low-pressure thermal CVD. The amorphous silicon film may be formed at a necessary thickness, and is formed at 500 Å in this embodiment.

After the amorphous silicon film is formed, a nickel acetate salt solution whose nickel concentration has been controlled at a given value is applied to the amorphous silicon film by spin coating.

Thereafter, in the same manner as in the first embodiment, the amorphous silicon film formed on the glass substrate 107 is crystallized by using the microwave irradiation apparatus of FIG. 1.

To start the microwave irradiation process, the substrate 107 is placed at a region where the electric field intensity of microwaves is maximum.

After the substrate 107 is set in place, the chamber 103 is closed and the air is purged by using a nitrogen gas. A high vacuum state is established by using an exhaust pump 105.

It is preferred that the high vacuum state is a vacuum state of such a level that formation of plasma is prohibited.

After a high vacuum state is established in the chamber 103 by the exhaust pump 105, the microwave oscillator 104 is operated to produce microwaves of 2.45 GHz. The microwaves are introduced into the chamber 103 via a waveguide 102, and applied to the amorphous silicon film formed on the substrate 107 to crystallize it.

By using a heater that is incorporated in the substrate holder 106, the substrate 107 is heated to 550° C. It is desirable that this temperature is set as high as possible but lower than the strain point of the glass substrate 107. In general, the temperature may be set in a range of 400° C. to the strain point of the glass substrate 107. Where a substrate other than the glass substrate 107 is used, the upper limit of the heating temperature may be determined in consideration of the heat resistance of the substrate used.

In general, measurement of the heating temperature is performed on the back surface of the glass substrate 107. Therefore, it is difficult to accurately measure the temperature of the silicon film formed on the glass substrate 107. In this case, the temperature of the back surface of the glass substrate may be used as the heating temperature.

After the amorphous silicon film is crystallized by irradiating it with microwaves, the substrate 107 is taken out of the apparatus and the crystallization process is completed.

Embodiment 3

This embodiment is directed to a method in which a silicon film that has been crystallized by application of microwaves is further subjected to heating. The additional heating is intended to provide a margin of the crystallization process, that is, to produce crystalline silicon films with higher reproducibility.

It is desirable that the additional heating, which is performed on a silicon film that has been subjected to crystallization by application of microwaves, be conducted in a temperature range of 400° C. to the strain point of a glass substrate.

In general, the heat treatment may be performed at 400–600° C. for 1–4 hours by using a heater or by irradiation with light emitted from an infrared lamp. This heating is effective in reducing defects in the film as well as improving its crystallinity.

In general, the additional heating enables production of crystalline silicon films whose film quality is constant, that is, does not vary from one process to another.

Embodiment 4

This embodiment is directed to a method in which a silicon film that has been crystallized by application of microwaves is further irradiated with laser light, to thereby improve its crystallinity and a margin of the crystallization process.

In general, as described above, the method of forming a crystalline silicon film by irradiating an amorphous silicon film with laser light has the problems that the film quality of a resulting crystalline silicon film is not uniform and varies from one process to another.

In contrast, where laser light irradiation is performed on an already crystallized silicon film as in this embodiment, its crystallinity can be improved with high reproducibility.

Where an amorphous silicon film is irradiated with laser light, there occurs an abrupt phase change from the amorphous state to the crystal state. Due to the abrupt phase change, the resulting crystal state is not high in reproducibility. In contrast, where laser light irradiation is performed on a silicon film that has been crystallized by heating by application with microwaves, there occurs no abrupt phase change and the effect of the laser light irradiation is constant. That is, the effect of the laser light irradiation can be made highly reproducible.

It is effective to simultaneously heat the silicon film during the laser light irradiation. It is preferred that the heating temperature be set at 400–600° C. The heating is effective in suppressing formation of clear crystal grain boundaries and roughening of the film surface by reducing energy impact of the laser light irradiation. The heating can also prevent formation of defects in the film.

Embodiment 5

This embodiment is directed to a method in which after an amorphous silicon film is crystallized by application of microwaves, laser light irradiation is performed to improve its crystallinity and thermal annealing is further performed. The laser light irradiation has an effect of improving the crystallinity of the film by crystallizing amorphous components remaining in the silicon film. The thermal annealing has an effect of reducing defects in the film.

Although this method requires an increased number of steps, it can produce crystalline silicon films of superior film quality with very high reproducibility.

Heating may be performed both before and after laser light irradiation. Further, a set of laser light irradiation and heating may be performed plural times. These modifications can improve the reproducibility of the crystallinity and the electrical properties of resulting crystalline silicon films.

Embodiment 6

Figure 2A:
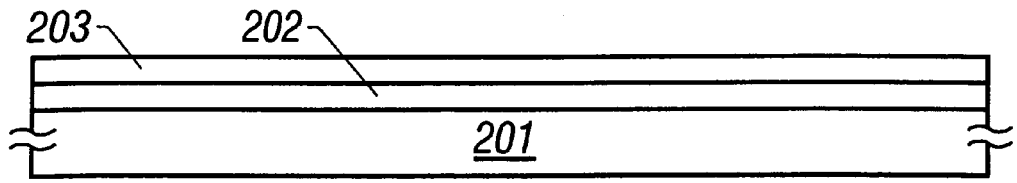
FIGS. 2A to 2D show a manufacturing process of a thin-film transistor according to a sixth embodiment of the invention.

This embodiment is directed to a manufacture of a thin-film transistor by using a crystalline silicon film produced according to the invention. FIGS. 2A to 2D show a manufacturing process of a thin-film transistor according to this embodiment. First, a 3,000-Å-thick silicon oxide film 202 as an undercoat film is formed on a glass substrate 201 by sputtering. A 500-Å-thick amorphous silicon film 203 is formed thereon by plasma CVD or low-pressure thermal CVD. (FIG. 2A)

Thereafter, microwaves are applied to the amorphous silicon film 203 by using the apparatus of FIG. 1, to thereby modify it into a crystalline silicon film. During this operation, the irradiation surface is heated to 550° C. The microwave irradiation is performed in a high vacuum.

The substrate position is adjusted by manipulating the adjustment rod 108 (see FIG. 1) so as to be located at a region where the electric field intensity is maximum.

After the amorphous silicon film 203 is crystallized by application of microwaves, laser light irradiation is performed to improve its crystallinity. A KrF excimer laser is used in this embodiment. The laser light is shaped into a linear beam of 5 mm in width and 20 cm in length, and has an energy density of 350 mJ/cm$^2$. During this laser light irradiation step, the irradiation surface is heated to 550° C.

Figure 2B:
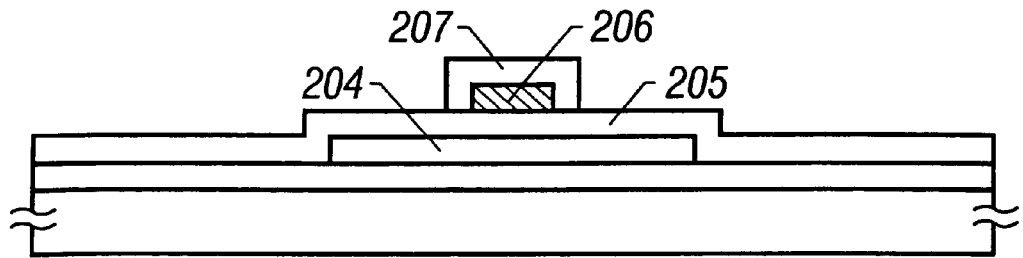

Thus, the amorphous silicon film 203 is modified into a crystalline silicon film. Then, the crystalline silicon film is patterned into an active layer 204 of a thin-film transistor as shown in FIG. 2B.

The amorphous silicon film 203 may be crystallized by utilizing the catalyst action of a metal element. In this case, in the state of FIG. 2A, a nickel acetate salt solution whose nickel concentration has been controlled at a given value is applied to the amorphous silicon film 203 by using a spinner, to provide a state that the metal element for accelerating crystallization of silicon is held in contact with the amorphous silicon film 203.

Then, by using the apparatus of FIG. 1, the substrate 201 is positioned at a region where the electric field intensity is maximum, the irradiation surface is heated to 550° C. and microwaves are applied to the amorphous silicon film 203 in a high vacuum, to modify it into a crystalline silicon film. After laser light irradiation under the same conditions as described above, the crystalline silicon film is patterned into an active layer 204 of a thin-film transistor as shown in FIG. 2B.

After the formation of the active layer 204 of the thin-film transistor, a 1,000-Å-thick silicon oxide film 205 as a gate insulating film is formed by plasma CVD or sputtering. To form a gate electrode, a 6,000-Å-thick film mainly made of aluminum is formed thereon by sputtering or electron beam evaporation. The aluminum film is patterned into a gate electrode 206. Further, a 2,000-Å-thick anodic oxide layer

207 is formed around the gate electrode 206 by performing anodization in an electrolyte with the gate electrode 206 used as the anode. Thus, a state of FIG. 2B is obtained.

Subsequently, to form source/drain regions, impurity ions are accelerated and implanted by ion implantation or plasma doping. Impurity ions are implanted into regions 208 and 211 because the gate electrode 206 and the anodic oxide layer 207 around it serve as a mask. In this embodiment, P (phosphorus) ions are implanted to form an N-channel thin-film transistor. No impurity ions are implanted into regions 209 because of the masking by the anodic oxide layer 207. Similarly, no impurity ions are implanted into a region 210 because of the masking by the gate electrode 206.

Figure 2C:
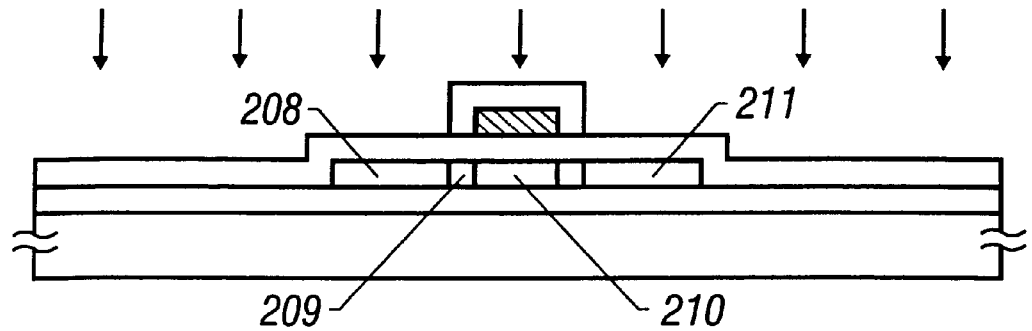

After the impurity ion implantation, laser light irradiation is performed to activate the implanted impurity ions and anneal the regions where the impurity ions have been implanted. Thus, a source region 208 and a drain region 211 are formed in a self-aligned manner. At the same time, offset gate regions 209 and a channel forming region 210 are formed. (FIG. 2C)

Figure 2D:
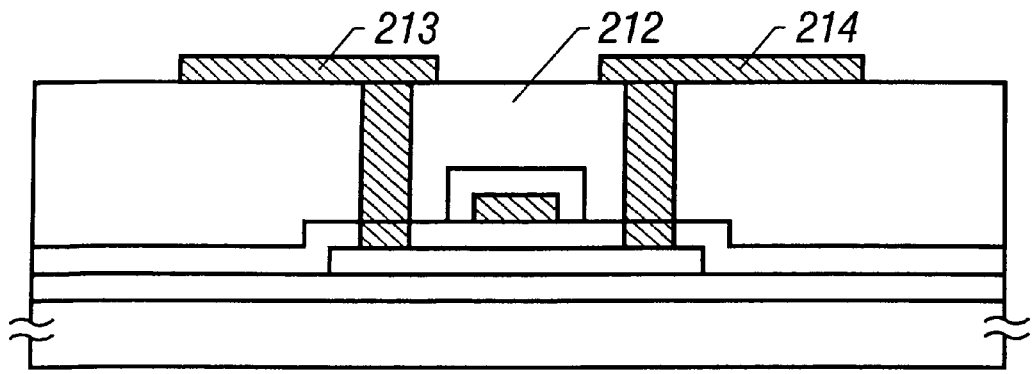

Thereafter, a 6,000-Å-thick silicon oxide film 212 as an interlayer insulating film is formed by plasma CVD. After contact holes are formed, a source electrode 213 and a drain electrode 214 are formed. A heat treatment is then performed for one hour in a hydrogen atmosphere of 350° C. Thus, a thin-film transistor is completed as shown in FIG. 2D.

Embodiment 7

FIGS. 3A to 3D show a manufacturing processing according to this embodiment. This embodiment is characterized in that in the thinfilm transistor manufacturing-process of FIGS. 2A to 2D the amorphous silicon film as patterned is crystallized by application of microwaves. That is, after a pattern (made of amorphous silicon) to constitute an active layer is formed, it is crystallized by application of microwaves.

In the manufacturing method of this embodiment, manufacturing conditions etc. are the same as in the sixth embodiment unless otherwise specified.

Figure 3A:
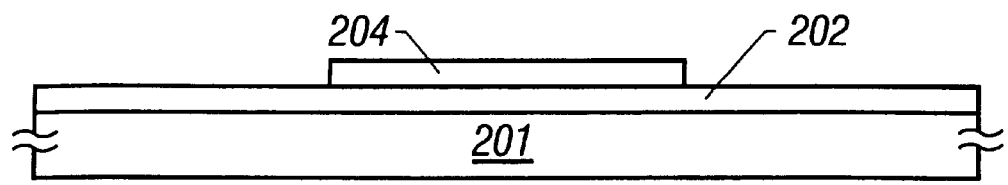
FIGS. 3A to 3D show a manufacturing process of a thin-film transistor according to a seventh embodiment of the invention.

First, a silicon oxide film 202 as an undercoat film is formed on a glass substrate as shown in FIG. 3A. An amorphous silicon film (not shown) is formed thereon, and then patterned into a region 204 that will become an active layer of a thin-film transistor. The region 204 is in a state of amorphous silicon. (FIG. 3A)

In this state, microwaves are applied to the amorphous silicon pattern by using the apparatus of FIG. 1. This manufacturing method is advantageous in that a region that is smaller than several tens of micrometers by several tens of micrometers is crystallized by application of microwaves, with a result of better crystallinity.

Figure 3B:
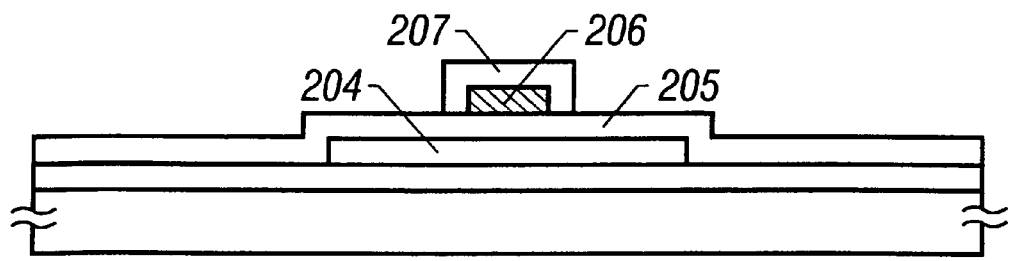
Figure 3C:
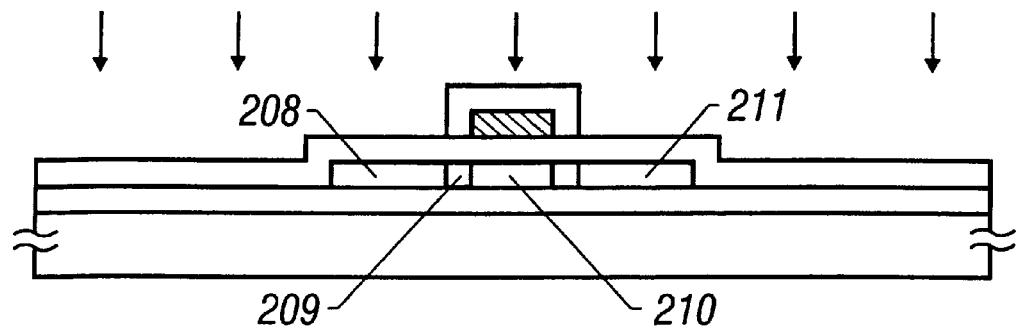
Figure 3D:
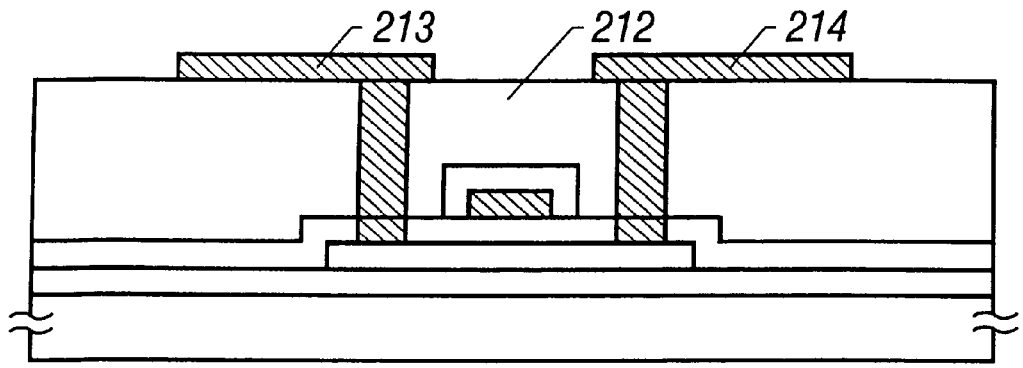

After the state of FIG. 3A is obtained, the same steps as the steps of FIGS. 2B to 2D are performed to complete a thin-film transistor: steps of FIGS. 3B to 3D are the same as the steps of FIGS. 2B to 2D. respectively.

As in the case of the second embodiment, the region 204 to become an active layer of a thin-film transistor may be crystallized by adding a metal element to it. In this case, after the region 204 to become an active layer is formed (see FIG. 3A), a nickel acetate salt solution whose nickel concentration has been controlled at a given value is applied to the region 204 by spin coating. Microwaves are then applied to the amorphous silicon region 204 by using the apparatus of FIG. 1, to thereby modify the region 204 into a crystalline active layer. The addition of nickel imparts better crystallinity to the active layer.

The manufacturing method of this embodiment can improve the crystallinity of the side faces of the active layer, and thereby reduce the concentration of trap states there. If trap states exist at a high concentration in the side faces of the active layer, at turn-off of a transistor an undesirable off-current may occur due to carrier movement via those trap states existing in the side faces of the active layer. Such an off-current can be reduced by improving the crystallinity of the side faces of the active layer and thereby reducing the concentration of trap states there as in this embodiment.

Embodiment 8

This embodiment is directed to a method in which microwaves are applied to an amorphous silicon film by using a mask formed thereon. In this embodiment, a mask is used to selectively crystallize an amorphous silicon film by selective application of microwaves.

Figure 4:
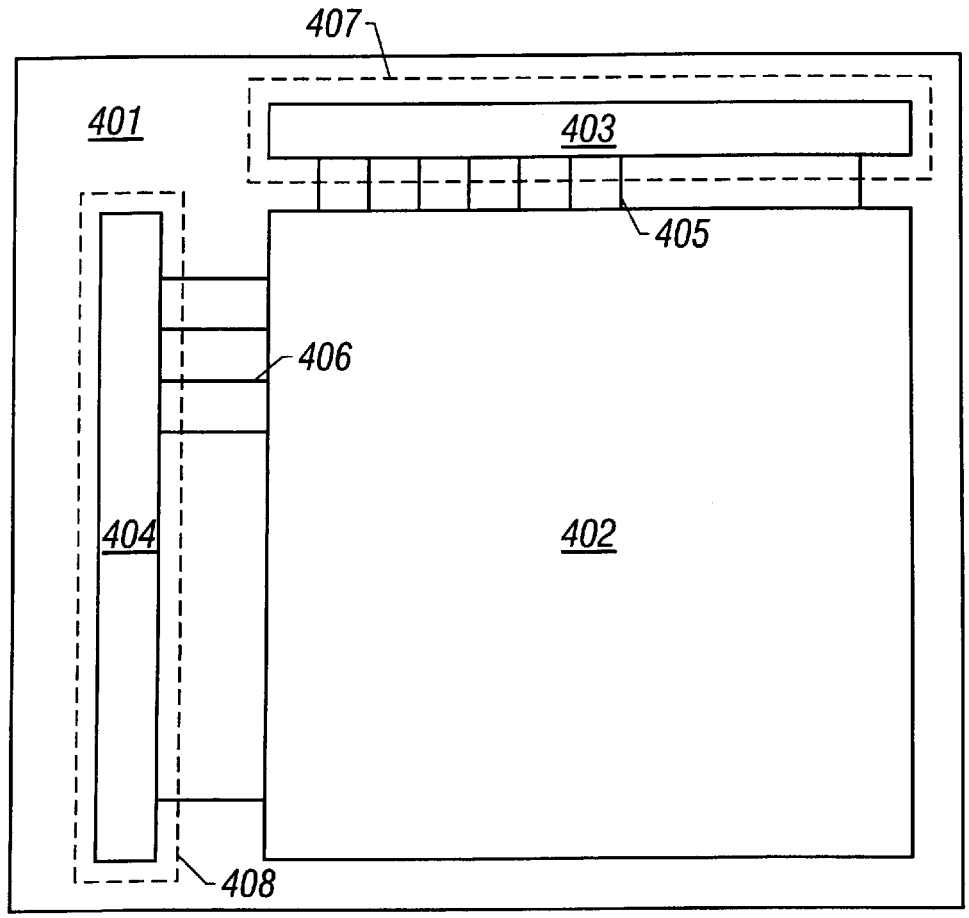
FIG. 4 shows the configuration of a substrate that constitutes an active matrix liquid crystal display device.

FIG. 4 schematically shows an active matrix liquid crystal display device that incorporates peripheral driver circuits. That is, FIG. 4 shows a configuration in which a pixel area and peripheral driver circuits for driving thin-film transistors arranged in the pixel area are integrated on the same glass substrate. Although FIG. 4 shows only one glass substrate, in constructing a liquid crystal cell an opposed glass substrate is prepared and a liquid crystal is held between the opposed glass substrate and the glass substrate of FIG. 4.

In the configuration of FIG. 4, there are formed on a class substrate 401 a pixel area 402 where pixel electrodes are arranged in a matrix of several hundred by several hundred, and peripheral driver circuits 403 and 404 for driving thin-film transistors arranged in the pixel area 402. The peripheral driver circuits 403 and 404 are connected to the pixel area 402 via wiring patterns 405 and 406.

At least one thin-film transistor is provided for each pixel of the pixel area 402. The peripheral driver circuits 403 and 404 are constituted by shift register circuits, analog buffer circuits, and other circuits.

In the configuration of FIG. 4, different characteristics are required for the thin-film transistors formed in the pixel area 402 and those formed in the peripheral driver circuits 403 and 404.

Although the thin-film transistors formed in the pixel area 402 are not required to have a large mobility, they are required to have a small off-current. If the thin-film transistors in the pixel area were formed by using a semiconductor film exhibiting a large mobility, light illumination might cause an erroneous or defective operation. Therefore, an unduly large mobility is not desirable.

On the other hand, the thin-film transistors formed in the peripheral driver circuits 403 and 404 are required to have a large mobility because they should operate fast and allow passage of a large current.

As described above, it is necessary to form thin-film transistor groups of different characteristics separately on a single glass substrate.

In this embodiment, to form thin-film transistors of different characteristics on a single glass substrate as mentioned above, regions having different degrees of crystallinity are selectively formed by selectively applying microwaves to an amorphous silicon film.

First, a silicon oxide film (not shown) as an undercoat film is formed on a glass substrate 401. An amorphous silicon film as a starting film for constituting active layers of thin-film transistors is formed thereon. A metal mask is disposed so that microwaves are applied to only regions 407 and 408. Microwaves of 2.45 Ghz (output power: 5 kW) are applied in this state by using the apparatus of FIG. 1.

Since microwaves are applied to only the regions 407 and 408 because of the existence of the mask, the amorphous silicon film is crystallized only in the regions 407 and 408.

In this state, the amorphous silicon film in the other region is left amorphous.

After the mask is removed, a heat treatment is performed at 550° C. for 2 hours. As a result of these steps, a crystalline silicon film is formed in the regions where the peripheral driver circuits 403 and 404 are formed while the amorphous silicon film is left in the region where thin-film transistors of the pixel area 402 are formed.

Thus, the peripheral driver circuits 403 and 404 can be constituted by thin-film transistors that are formed by using a crystalline silicon film that exhibits a large mobility, while the pixel area 402 can be constituted by thin-film transistors that are formed by using an amorphous silicon film that provides a small mobility and a small off-current.

Embodiment 9

This embodiment is characterized in that microwaves having different intensities are applied selectively to an amorphous silicon film by selectively attenuating microwaves so that regions having different degrees of crystallinity are formed selectively.

In general, quartz glass transmits microwaves almost completely. On the other hand, an amorphous silicon film absorbs microwaves. Therefore, by properly setting the thickness of an amorphous silicon film (i.e., a mask), microwaves of lower power can be applied to a masked region than to the other regions.

Figure 5:
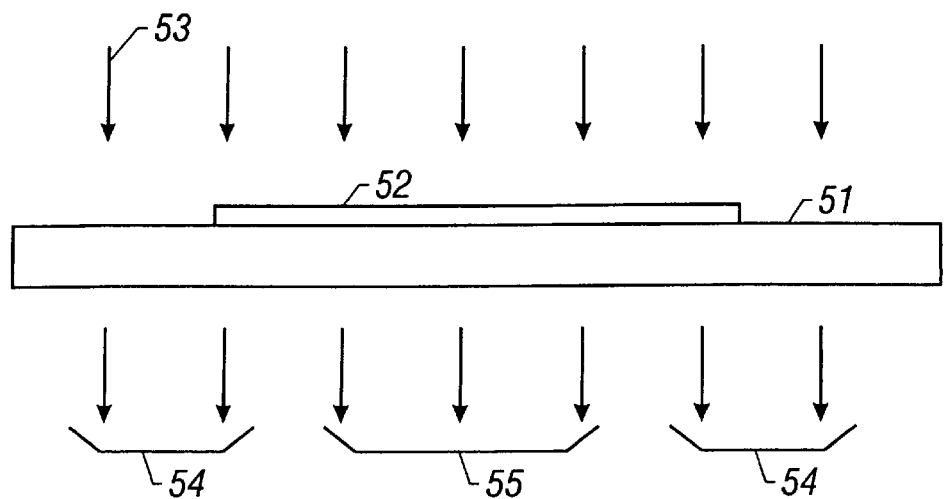
FIG. 5 shows the structure of a mask for partially attenuating microwaves.

This embodiment is intended to apply weaker microwaves to the region of the pixel area 402 of the substrate shown in FIG. 4. To this end, a quartz glass substrate having a thin (for instance, 500 Å in thickness) amorphous silicon film in a region corresponding to the pixel area 402 is prepared and placed on the glass substrate 401. Microwaves are applied in this state, FIG. 5 schematically shows how microwaves are transmitted through a quarts glass substrate 51 on which an amorphous silicon film 52 is formed. This is a mask for partially attenuating microwaves.

As microwaves 53 pass through the quartz glass substrate 51, a certain part of them are absorbed by the amorphous silicon film 52, so that microwaves 55 that have passed through the amorphous silicon film 52 has a low energy than microwaves 54 that have passed through the other regions. The degree of attenuation of microwaves can be changed by controlling the thickness of the amorphous silicon film 52.

By applying microwaves to the glass substrate 401 through a mask of a quartz glass substrate on which an amorphous silicon film is formed in the region corresponding to the pixel area 402 (see FIG. 4). the power of microwaves applied to the region of the pixel area 402 can be made lower than that of microwaves applied to the other regions. As a result, the degree of crystallinity of the region of the pixel area 402 can be made lower than that of the other regions.

A low degree of crystallinity results in a small mobility and a large resistance, and an off-current is reduced as much. Conversely, a high degree of crystallinity means a silicon film having a large mobility.

In this manner, thin-film transistors formed in the pixel area 402 can be given a small mobility and a small off-current. In contrast, thin-film transistors formed in the peripheral driver circuits 403 and 404 can be given a large mobility.

Embodiment 10

Figure 6:
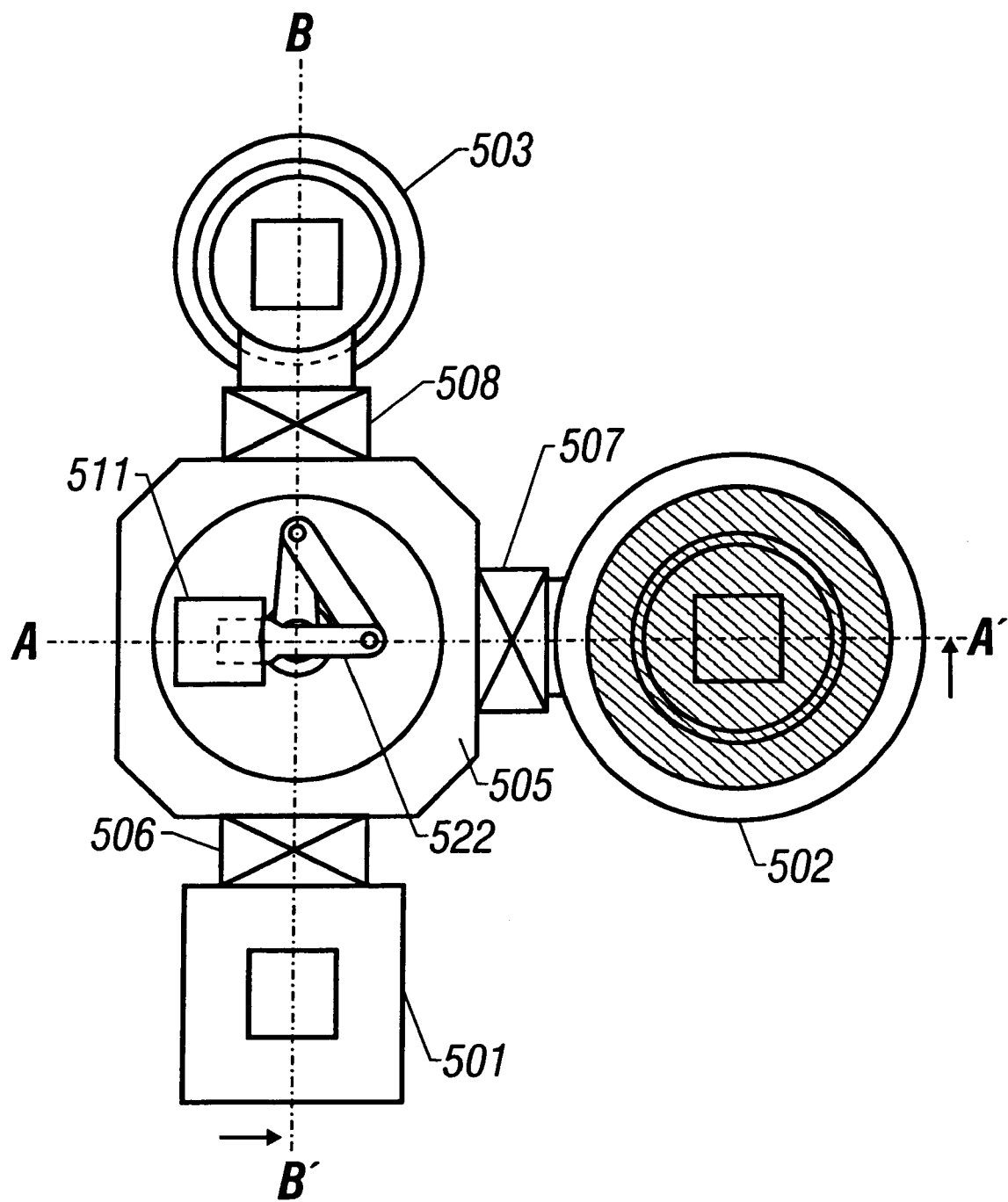
FIGS. 6 to 8 schematically show an apparatus for applying microwaves used in a tenth embodiment of the invention.

FIG. 6 shows an apparatus used in this embodiment. The apparatus of FIG. 6 is characterized by successively performing the following steps in a controlled atmosphere (including a high vacuum state): a step of preliminarily heating a substrate (in general, a glass substrate) on which an amorphous silicon film is formed, a step of crystallizing the amorphous silicon film by irradiating it with microwaves, and a step of additionally heating the substrate to obtain a crystalline silicon film.

The apparatus of FIG. 6 has a substrate input/output chamber 501 for input/output of substrates to and from the apparatus. a processing chamber 502 for applying microwaves to an amorphous silicon film formed on a substrate, a heating chamber 503 for heating amorphous silicon films formed on respective substrates, and a substrate transport chamber 505 having means for transporting a substrate between the respective chambers 501 to 503.

Figure 7:
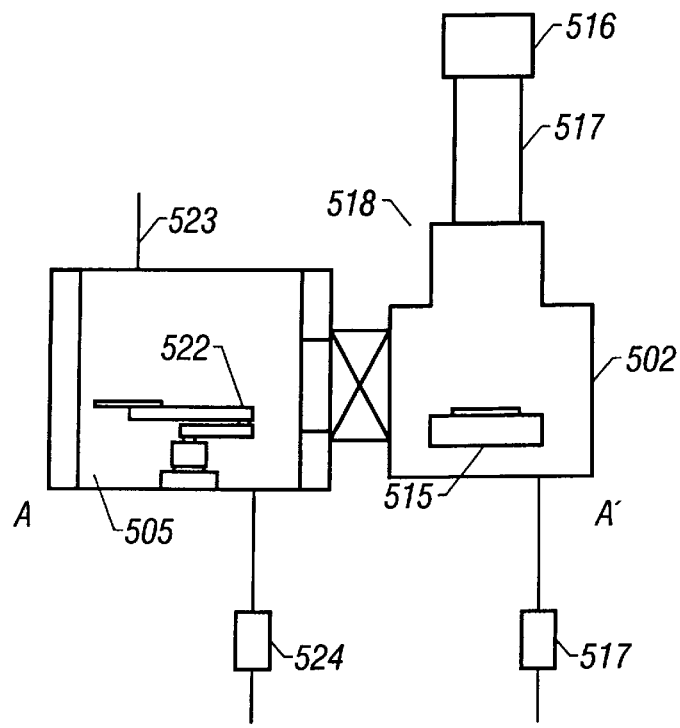
Figure 8:
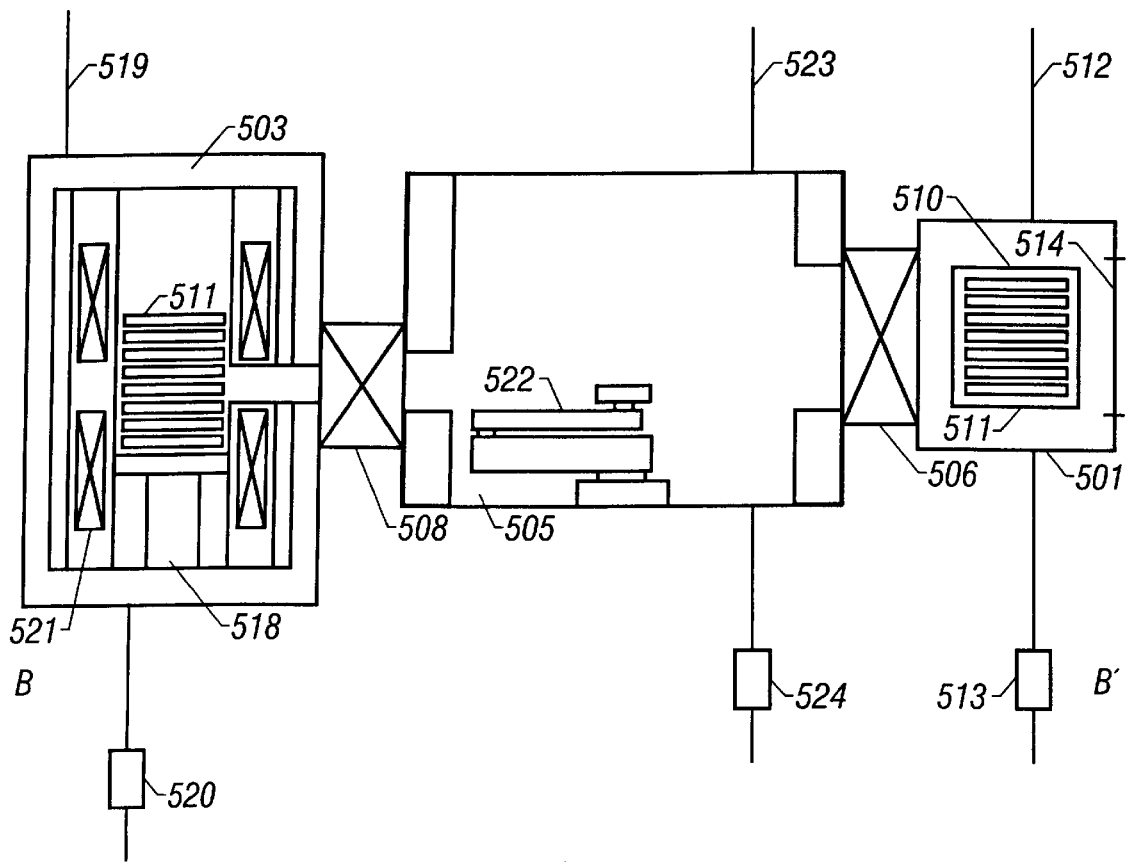
Figure 9:
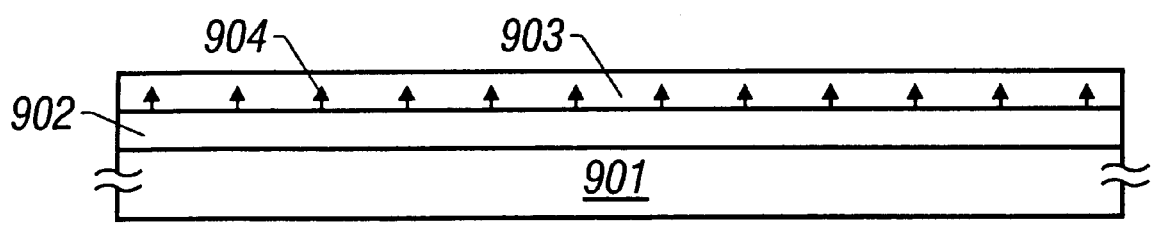
FIGS. 9 and 10 show examples illustrating how crystallization proceeds by application of microwaves.
Figure 10:
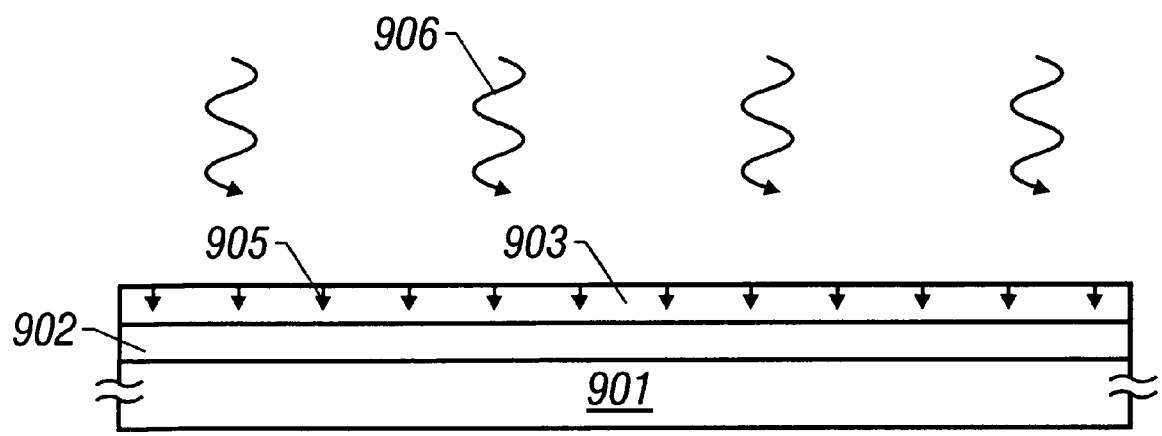

FIG. 7 is a sectional view taken along line A–A' in FIG. 6, and FIG. 8 is a sectional view taken along line B–B' in FIG. 6. The respective chambers are so constructed as to be kept airtight and to be rendered in a high vacuum state when necessary. The respective chambers 501 to 503 are connected to the substrate transport chamber (common chamber) 505 via gate valves 506 to 508, respectively. The gate valves 506 to 508 are so constructed as to be kept sufficiently airtight.

The respective chambers will be described below in detail. Reference numeral 501 denotes the substrate input/output chamber for input/output of substrates to and from the apparatus. As shown in FIG. 8, a number of substrates 511 accommodated in a cassette 510 are input the apparatus from the outside through a door 514 on a cassette-by-cassette basis. Further, substrates that have been processed are output from the apparatus to the outside through the door 514 also on a cassette-by-cassette basis.

The substrate input/output chamber 501 is equipped with a system 512 for introducing a purge gas such as an inert gas, and an exhaust pump 513 for discharging an unnecessary gas, reducing the pressure inside the chamber, or establishing a high vacuum state in the chamber. The purge gas is used to establish a clear state in the chamber by filling the chamber with a clear gas.

Denoted by numeral 502 is FIGS. 6 and 7 is the processing chamber for applying microwaves to an amorphous silicon film formed on a substrate. Microwaves are generated by an oscillator 516 and introduced into the processing chamber 502 via a waveguide 517. Crystallization is performed on a sample placed on a substrate stage 515 by using the microwaves thus generated. The processing chamber 502 is so constructed as to be able to adjust the height of the substrate stage 515.

The processing chamber 502 is equipped with an exhaust system including a gas introduction system (not shown) and an exhaust pump 504. A purge inert gas or a gas (for instance, air) in which plasma is hardly formed is supplied through the gas introduction system.

Denoted by numeral 503 in FIGS. 6 and 8 is the heating chamber for heating silicon films. A number of substrates 511 on which silicon films are formed are accommodated on a vertically movable stage 518. The substrates accommodated on the stage 518 are heated by a heater 521 in the heating chamber 503.

The heating chamber 503 is also equipped with a purge inert gas introduction system 519 and an exhaust pump 520 that can establish a high vacuum state in the heating chamber 503.

The substrate transport chamber 505 has a function of transporting a substrate 511 with a robot arm 522. The substrate transport chamber 505 is also equipped with a purge inert gas introduction system 523 and an exhaust pump 524 that can establish a high vacuum state in the substrate transport chamber 505. A hand portion of the robot arm 522 for holding a substrate incorporates a heater to prevent a temperature variation of a transporting substrate.

In an actual operation, it is important that the inside of the transport chamber 505 be kept in a high vacuum state during transport of a substrate (sample).

An example of operation of the apparatus shown in FIGS. 6 to 8 will be described below. First, a number of glass substrates 511 to be processed are accommodated in the cassette 510. In a high vacuum state, substrates 511 are transported one by one into the heating chamber 503 with the robot arm 522. The substrates 511 are heated to 550° C. in the heating chamber 503. The heating accelerates removal of hydrogen from the films, to thereby provide a state that crystallization is effected more easily. It is preferred that the heating be performed in a high vacuum state, or in an inert gas atmosphere.

After the heating is performed for a given period (for instance, one hour) in the heating chamber 503, a substrate is taken out and transported into the microwave irradiation chamber 502 with the robot arm 522. In the chamber 502, microwaves are applied to an amorphous silicon film that is formed on the pre-heated glass substrate, to crystallize the film. It is preferred that the microwave irradiation be performed in a high vacuum state. If it is difficult to perform the microwave irradiation in a high vacuum state, it is necessary to select a frequency and a power of microwaves and an atmosphere so as to establish a state that no light emission is observed visually.

After the crystallization of the amorphous silicon film by the microwave irradiation, the substrate is returned with the robot arm 522 to the heating room 503, where it is subjected to heating after the crystallization. After being subjected to the heating of a given period (for instance, 2 hours), the substrate is transported into the cassette 510 that is provided in the substrate input/output chamber 501. Thus, the series of operations is finished.

In the above example of operation, heating an amorphous silicon film at 550° C. for 2 hours, crystallizing it by the microwave irradiation, and thermally annealing the crystallized silicon film at 550° C. for 2 hours are performed in a controlled atmosphere (preferably in a high vacuum). At each transport of a substrate, the gate valve 506, 507 or 508 is opened and then closed to prevent heat from the heating chamber 503 or microwaves from the chamber 502 from influencing the other chambers.

Enabling continuous processing, the apparatus of this embodiment can provide high productivity. Further, the apparatus can realize high reproducibility by conducting atmosphere control.

As described above, according to the invention, an amorphous silicon film can be modified into a crystalline silicon film by applying microwaves to the amorphous silicon film. By combining this technique with a laser light irradiation step and/or heating step, crystalline silicon films can be obtained with higher reproducibility.

The degree of crystallinity of a silicon film can further be improved by adding to an amorphous silicon film a metal element for accelerating crystallization of silicon.

In the crystallization of an amorphous silicon film by the microwave irradiation, since the amorphous silicon film can be heated selectively, a crystalline silicon film can be formed even on a glass substrate without imparting thermal damage to the glass substrate.

What is claimed is:

1. A method of manufacturing a semiconductor device comprising the steps of:

forming a semiconductor film comprising amorphous silicon over a substrate having an insulating surface wherein said semiconductor film contains hydrogen;

irradiating said semiconductor film with a microwave to crystallize the semiconductor film;

patterning the crystallized semiconductor film into at least one semiconductor island; and forming at least one pair of impurity regions in said semiconductor island to form a channel region defined therebetween.

2. The method of claim 1 wherein said microwave has a frequency in the range from 1 GHz to 10 GHz.

3. The method of claim 1 wherein said substrate is a glass substrate.

4. The method of claim 1 wherein said microwave is applied to a selected portion of said amorphous semiconductor film by placing a mask thereon.

5. The method of claim 1 wherein said microwave is applied after removing a portion of said hydrogen from said amorphous semiconductor film.

6. The method of claim 1 further comprising the step of heating said crystalline semiconductor film.

7. The method of claim 1 further comprising the step of irradiating said crystalline semiconductor film with laser.

8. The method of claim 1 wherein an upper surface portion of said semiconductor film is selectively heated by a skin effect caused by the application of said microwave.

9. The method of claim 1 wherein said semiconductor device is an active matrix display device.

10. A method of manufacturing a semiconductor device comprising the steps of:

forming an amorphous semiconductor film over a substrate having an insulating surface wherein said semiconductor film contains hydrogen; and irradiating said amorphous semiconductor film with a microwave to crystallize said amorphous semiconductor film;

patterning the crystallized semiconductor film into at least one semiconductor island for forming an active layer of a thin film transistor, wherein said microwave is applied to said semiconductor film in a non-plasma atmosphere.

11. The method of claim 10 wherein said microwave has a frequency in the range from 1 GHz to 10 GHz.

12. The method of claim 10 wherein said substrate is a glass substrate.

13. The method of claim 10 wherein said semiconductor device is an active matrix display device.

14. The method of claim 10 wherein said microwave is applied after removing a portion of said hydrogen from said amorphous semiconductor film.

15. The method of claim 10 further comprising the step of heating said crystalline semiconductor film.

16. The method of claim 10 further comprising the step of irradiating said crystalline semiconductor film with laser.

17. The method of claim 10 further comprising the steps of heating said crystalline semiconductor film and irradiating said crystalline semiconductor film with laser.

18. A method of manufacturing a semiconductor device comprising the steps of:

disposing a metal containing substance in contact with an amorphous semiconductor film comprising silicon formed over a substrate having an insulating surface, said metal being capable of promoting a crystallization of said semiconductor film wherein said semiconductor film contains hydrogen;

irradiating said amorphous semiconductor film with a microwave to crystallize said amorphous semiconductor film; and patterning the crystallized semiconductor film into at least one semiconductor island for forming an active layer of a thin film transistor.

19. The method of claim 18 wherein said microwave has a frequency in the range from 1 GHz to 10 GHz.

20. The method of claim 18 wherein said substrate is a glass substrate.

21. The method of claim 18 wherein said microwave is applied to a selected portion of said amorphous semiconductor film by placing a mask thereon.

22. The method of claim 18 wherein said metal is one or more elements selected from the group consisting of Fe, Co, Ni, Ru, Rh, Pd, Os, Ir, Pt, Cu and Au.

23. The method of claim 18 wherein said microwave is applied after removing a portion of said hydrogen from said amorphous semiconductor film.

24. The method of claim 18 further comprising the step of heating said crystallized semiconductor film.

25. The method of claim 18 further comprising the step of irradiating said crystallized semiconductor film with laser.

26. The method of claim 18 wherein said semiconductor device is an active matrix display device.

27. The method of claim 18 further comprising the steps of heating said crystallized semiconductor film and irradiating said crystalline semiconductor film with laser.

28. A method of manufacturing a semiconductor device comprising the steps of:

forming a semiconductor film comprising amorphous silicon over a substrate having an insulating surface wherein said semiconductor film contains hydrogen;

patterning the semiconductor film comprising the amorphous silicon into at least one semiconductor island for forming an active layer of a thin film transistor;

irradiating said semiconductor island with a microwave to crystallize the semiconductor island.

29. The method of claim 28 wherein said microwave has a frequency in the range from 1 GHz to 10 GHz.

30. The method of claim 28 further comprising the step of heating said crystalline semiconductor film.

31. The method of claim 28 further comprising the step of irradiating said crystalline semiconductor film with laser.

32. The method of claim 28 wherein said semiconductor device is an active matrix display device.

33. A method of manufacturing a semiconductor device comprising the steps of:

forming a semiconductor film comprising amorphous silicon over a substrate having an insulating surface wherein said semiconductor film contains hydrogen; and patterning the semiconductor film comprising the amorphous silicon into at least one semiconductor island for forming an active layer of a thin film transistor;

irradiating said semiconductor island with a microwave to crystallize said amorphous semiconductor island, wherein said microwave is applied to said semiconductor island in a non-plasma atmosphere.

34. The method of claim 33 wherein said microwave has a frequency in the range from 1 GHz to 10 GHz.

35. The method of claim 33 wherein said semiconductor device is an active matrix display device.

36. A method of manufacturing a semiconductor device comprising the steps of:

forming a semiconductor film comprising amorphous silicon over a substrate having an insulating surface by plasma CVD heating said semiconductor film by applying a microwave to crystallize the semiconductor film;

patterning the crystallized semiconductor film into at least one semiconductor island for forming an active layer of a thin film transistor;

forming a gate insulating film on the semiconductor island; and forming a gate electrode on said gate insulating film.

37. The method of claim 36 wherein said microwave has a frequency in the range from 1 GHz to 10 GHz.

38. The method of claim 36 wherein said semiconductor device is an active matrix device.

* * * * *